(12) United States Patent
Byun et al.

(10) Patent No.: US 11,611,020 B2
(45) Date of Patent: Mar. 21, 2023

(54) WIDE COLOR GAMUT LIGHT-EMITTING ELEMENT

(71) Applicant: Seoul Semiconductor Co., Ltd., Ansan-si (KR)

(72) Inventors: Ho Jun Byun, Ansan-si (KR); Bo Yong Han, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 17/022,070

(22) Filed: Sep. 15, 2020

(65) Prior Publication Data

US 2020/0411733 A1 Dec. 31, 2020

Related U.S. Application Data

(63) Continuation of application No. 16/066,401, filed as application No. PCT/KR2016/014758 on Dec. 16, 2016, now abandoned.

(30) Foreign Application Priority Data

Dec. 28, 2015 (KR) .................. 10-2015-0187839

(51) Int. Cl.
*H01L 33/50* (2010.01)
*H01L 25/075* (2006.01)
(Continued)

(52) U.S. Cl.
CPC .......... *H01L 33/502* (2013.01); *C09K 11/643* (2013.01); *C09K 11/7734* (2013.01);
(Continued)

(58) Field of Classification Search
CPC . H01L 25/0753; H01L 33/483; H01L 33/486; H01L 33/502; H01L 33/504; H01L 33/56
See application file for complete search history.

(56) References Cited

U.S. PATENT DOCUMENTS 7,423,296 B2 9/2008 Chua
7,455,423 B2 11/2008 Takenaka
(Continued)

FOREIGN PATENT DOCUMENTS

JP 2010-080935 4/2010
JP 2012-199539 10/2012
(Continued)

OTHER PUBLICATIONS

International Search Report dated Mar. 17, 2017 in International Application No. PCT/KR2016/014758 (with English Translation).
(Continued)

*Primary Examiner* — Andres Munoz
(74) *Attorney, Agent, or Firm* — H.C. Park & Associates, PLC

(57) ABSTRACT

A light emitting element including a housing having a cavity and an inner wall, a light emitting part disposed in the cavity to emit light having a peak wavelength in a blue wavelength band and including first and second light emitting chips spaced apart from each other, a lead portion to supply external electric power, and a wavelength converter including a first phosphor layer including a first phosphor to emit light having a peak wavelength in a green wavelength band, and a second phosphor layer including a second phosphor to emit light having a peak wavelength in a red wavelength band, in which the second phosphor includes at least one of a nitride-based red phosphor and a fluoride-based red phosphor represented by $A_2MF_6:Mn^{4+}$, A is one of Li, Na, K, Ba, Rb, Cs, Mg, Ca, Se, and Zn, and M is one of Ti, Si, Zr, Sn, and Ge.

14 Claims, 8 Drawing Sheets

(51) Int. Cl.
*C09K 11/64* (2006.01)
*C09K 11/77* (2006.01)
*H01L 33/48* (2010.01)
*H01L 33/56* (2010.01)

(52) U.S. Cl.
CPC ........ *H01L 25/0753* (2013.01); *H01L 33/483* (2013.01); *H01L 33/56* (2013.01); *H01L 33/486* (2013.01); *H01L 33/504* (2013.01)

(56) References Cited

U.S. PATENT DOCUMENTS

| | | | |
|---|---|---|---|
| 7,488,990 | B2 | 2/2009 | Oon et al. |
| 7,497,973 | B2 | 3/2009 | Radkov et al. |
| 7,847,303 | B2 | 12/2010 | Jung et al. |
| 8,183,583 | B2 | 5/2012 | Jung et al. |
| 8,415,870 | B2 | 4/2013 | Oshio |
| 8,760,049 | B2 | 6/2014 | Cha et al. |
| 8,952,407 | B2 | 2/2015 | Son |
| 9,041,046 | B2 | 5/2015 | Phang et al. |
| 9,666,773 | B2 | 5/2017 | Yoo et al. |
| 9,735,322 | B2 | 8/2017 | Oh et al. |
| 9,741,907 | B2 | 8/2017 | Oh et al. |
| 9,929,319 | B2 | 3/2018 | Setlur et al. |
| 10,347,804 | B2 | 7/2019 | Yoo et al. |
| 10,522,518 | B2 | 12/2019 | Ng et al. |
| 2005/0224828 | A1 | 10/2005 | Oon et al. |
| 2006/0169998 | A1 | 8/2006 | Radkov et al. |
| 2006/0245188 | A1 | 11/2006 | Takenaka |
| 2009/0050912 | A1 | 2/2009 | Chu et al. |
| 2010/0025700 | A1* | 2/2010 | Jung .................. F21V 7/26 257/89 |
| 2010/0090231 | A1 | 4/2010 | Jung et al. |
| 2011/0102706 | A1 | 5/2011 | Oshio |
| 2012/0162979 | A1 | 6/2012 | Ng et al. |
| 2012/0195020 | A1 | 8/2012 | Cha et al. |
| 2012/0235188 | A1 | 9/2012 | Phang et al. |
| 2012/0236529 | A1 | 9/2012 | Phang et al. |
| 2013/0049052 | A1 | 2/2013 | Son |
| 2013/0050982 | A1 | 2/2013 | Phang et al. |
| 2015/0228869 | A1 | 8/2015 | Yoo et al. |
| 2015/0361270 | A1* | 12/2015 | Tasaki .................. C09D 7/61 524/588 |
| 2016/0049560 | A1 | 2/2016 | Oh et al. |
| 2017/0018692 | A1 | 1/2017 | Oh et al. |
| 2017/0309796 | A1 | 10/2017 | Oh et al. |
| 2019/0013446 | A1 | 1/2019 | Byun et al. |

FOREIGN PATENT DOCUMENTS

| | | |
|---|---|---|
| JP | 2015-221905 | 12/2015 |
| KR | 10-2013-0023841 | 3/2013 |
| KR | 10-2015-0089232 | 8/2015 |
| KR | 10-2015-0094402 | 8/2015 |
| KR | 20170045545 A * | 4/2017 |

OTHER PUBLICATIONS

Non-Final Office Action dated Mar. 8, 2019, issued in U.S. Appl. No. 16/066,401.

Final Office Action dated Jul. 18, 2019, issued in U.S. Appl. No. 16/066,401.

Non-Final Office Action dated Jan. 8, 2020, issued in U.S. Appl. No. 16/066,401.

Final Office Action dated Jun. 4, 2020, issued in U.S. Appl. No. 16/066,401.

Office Action dated Aug. 3, 2022 from the Korean Patent Office for Korean Patent Application No. 20150187839 (with English Translation).

* cited by examiner

WIDE COLOR GAMUT LIGHT-EMITTING ELEMENT

CROSS-REFERENCE TO RELATED APPLICATIONS

This application is a Continuation of U.S. patent application Ser. No. 16/066,401 filed on Jun. 27, 2018, which is National Stage Entry of International Patent Application No. PCT/KR2016/014758, filed on Dec. 16, 2016, and claims priority from and the benefit of Korean Patent Application No. 10-2015-0187839, filed on Dec. 28, 2015, each of which is incorporated by reference for all purposes as if fully set forth herein.

BACKGROUND

Field

Exemplary embodiments of the invention relate generally to a light emitting element and, more specifically, to a wide color gamut light emitting element.

Discussion of the Background

Light emitting diode (LED) backlight units used in liquid crystal displays (LCDs) may generally be classified into an RGB LED chip type using red, green, and blue light emitting diode chips (RGB LED chips), and a phosphor type using blue light emitting diodes and phosphors. The RGB LED chip type typically has a higher color gamut than the phosphor type. However, the RGB LED chip type has problems, such as lower reliability of the green light emitting diode or the red light emitting diode than the blue light emitting diode, and high manufacturing costs. Accordingly, most display manufacturers generally adopt the phosphor type.

In the phosphor type, phosphors emitting a yellowish green or yellow color through absorption of blue light as excitation light are deposited onto a blue light emitting diode chip to convert the wavelength of blue light. However, as shown in FIG. 1, since a light emitting element of the phosphor type adopts luminance of yellow phosphors, such a light emitting element has low color gamut due to spectrum deficiency in green and red wavelength ranges of light emitted therefrom.

On the other hand, broadcast content for LCD TVs is produced by a broadcasting station, in accordance with ITU-R BT.709 corresponding to the parameter values of the HDTV standard image format, and then is transmitted to individual TVs. As defined in ITU-R BT.709, reference RGB color coordinates are represented by R(x 0.64, y 0.33), G(x 0.3, y 0.6), and B(x 0.15, y 0.06) in the CIE xy coordinate system. In addition, the reference RGB color coordinates are represented by R(u' 0.451, v' 0.523), G(u' 0.125, v' 0.563), and B(u' 0.175, v' 0.158) in the CIE u'v' coordinate system.

Accordingly, as shown in FIG. 2, it can be seen that a color gamut of light emitted from a light emitting element adopting yellow phosphors is similar to the color gamut in accordance with ITU-R BT.709.

However, a recent trend is directed to realizing colors having higher purity than the colors in the color gamut in accordance with ITU-R BT.709. Thus, various studies have been conducted to develop light emitting elements satisfying the Adobe or D-Cinema standard that define RGB coordinates having higher purity than the RGB coordinates of ITU-R BT.709.

The RGB coordinates in accordance with the Adobe standard are represented by R(x 0.64, y 0.33), G(x 0.21, y 0.71), and B(x 0.15, y 0.06) in the CIE xy coordinate system, and by R(u' 0.451, v' 0.523), G(u' 0.076, v' 0.576), and B(u' 0.175, v' 0.158) in the CIE u'v' coordinate system. In addition, the RGB coordinates in accordance with the D-Cinema standard are represented by R(x 0.68, y 0.32), G(x 0.265, y 0.690), and B(x 0.15, y 0.06) in the CIE xy coordinate system, and by R(u' 0.496, v' 0.526), G(u' 0.099, v' 0.578), and B(u' 0.175, v' 0.158) in the CIE u'v' coordinate system.

FIG. 3 and FIG. 4 show the color gamut of light emitted from light emitting elements, to which yellow phosphors and the color coordinate systems of the Adobe and D-Cinema standards are applied, respectively. However, the light emitting element to which the yellow phosphors are applied fails to satisfy the color coordinates of the green region, as compared with the light emitting element of the Adobe standard, and fails to satisfy the color coordinates of the green region and the red region, as compared with the light emitting element of the D-cinema standard, thereby making it difficult to realize colors having high purity.

The above information disclosed in this Background section is only for understanding of the background of the inventive concepts, and, therefore, it may contain information that does not constitute prior art.

SUMMARY

Exemplary embodiments of the present invention provide a wide color gamut light emitting element capable of improving a color gamut using phosphors.

A light emitting element according to an exemplary embodiment includes a first light emitting diode chip to emit emitting light having a peak wavelength in the range of 350 nm to 420 nm, a second light emitting diode chip separated from the first light emitting diode chip and to emit light having a peak wavelength in the range of 430 nm to 470 nm, a green phosphor formed on the first light emitting diode chip, and a red phosphor formed on the second light emitting diode chip, in which the green phosphor includes a BAM-based green phosphor.

The BAM-based green phosphor may include a single kind of phosphor.

The BAM-based green phosphor may include at least one of $(Ba,Sr,Ca)MgAl_{10}O_{17}:Mn^{2+},Eu^{2+}$ and $BaMgAl_{10}O_{17}:Mn^{2+}$.

The red phosphor may include at least one of a nitride-based red phosphor and a fluoride-based red phosphor.

The nitride-based red phosphor may include at least one of phosphors represented by $MSiN_2$, $MSiON_2$ and $M_2Si_5N_8$, where M is one of Ca, Sr, Ba, Zn, Mg, and Eu.

The fluoride-based red phosphor may be a phosphor represented by $A_2MF_6:Mn^{4+}$, where A is one of Li, Na, K, Ba, Rb, Cs, Mg, Ca, Se, and Zn, and M is one of Ti, Si, Zr, Sn, and Ge.

Light emitted from the light emitting element may be a combination of light emitted from the first and second light emitting diode chips, light emitted from the green phosphor, and light emitted from the red phosphor.

A color gamut of the light may have an NTSC value of 100% or more.

The red phosphor may cover the green phosphor.

The red phosphor may be separated from the green phosphor.

The lighting element may further include a housing having a cavity defined therein, in which wherein the first and second light emitting diode chips are received in the cavity.

The housing may include a plurality of cavities, and the first light emitting diode chip and the second light emitting diode chip may be received in different cavities, respectively.

A light emitting element according to another exemplary embodiment includes a first light emitting diode chip to emit emitting light having a peak wavelength in the range of 350 nm to 420 nm, a second light emitting diode chip separated from the first light emitting diode chip and to emit emitting light having a peak wavelength in the range of 430 nm to 470 nm, a green phosphor formed on the first light emitting diode chip, and a red phosphor formed on the second light emitting diode chip, in which the red phosphor includes at least one of a nitride-based red phosphor and a fluoride-based red phosphor, the red phosphor covering the green phosphor.

The light emitting element may further include a housing having a cavity defined therein, in which the first and second light emitting diode chips may be received in the cavity, and the red phosphor may cover the cavity of the housing.

light emitted from the light emitting element may be a combination of light emitted from the first and second light emitting diode chips, light emitted from the green phosphor, light emitted from the red phosphor, and light emitted from the green and red phosphors.

A light emitting element according to still another exemplary embodiment includes a first light emitting diode chip to emit light having a peak wavelength in the range of 350 nm to 420 nm, a second emitting diode chip separated from the first light emitting diode chip and to emit light having a peak wavelength in the range of 430 nm to 470 nm, a green phosphor formed on the first light emitting diode chip, and a red phosphor formed on the first light emitting diode chip and the second light emitting diode chip, in which light emitted from the light emitting element is a combination of light emitted from the first and second light emitting diode chips, light emitted from the green phosphor, light emitted from the red phosphor, and light emitted from the green and red phosphors.

The red phosphor may include at least one of a nitride-based red phosphor and a fluoride-based red phosphor, and the red phosphor may cover the green phosphor.

The light emitting element may further include a housing having a cavity defined therein, in which the first and second light emitting diode chips may be received in the cavity, and the red phosphor may cover the cavity of the housing.

BRIEF DESCRIPTION OF DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Hereinafter, exemplary embodiments of the present invention will be described in detail with reference to the accompanying drawings.

A light emitting element according to an exemplary embodiment includes: a first light emitting diode chip emitting light having a peak wavelength in the range of 350 nm to 420 nm; a second light emitting diode chip separated from the first light emitting diode chip and emitting light having a peak wavelength in the range of 430 nm to 470 nm; a green phosphor formed on the first light emitting diode chip; and a red phosphor formed on the second light emitting diode chip, in which the green phosphor includes a BAM-based green phosphor.

The BAM-based green phosphor may include a single kind of phosphor. For example, the BAM-based green phosphor may include $(Ba,Sr,Ca)MgAl_{10}O_{17}:Mn^{2+},Eu^{2+}$ or $BaMgAl_{10}O_{17}:Mn^{2+}$.

The red phosphor may be a nitride-based red phosphor or a fluoride-based red phosphor. The nitride-based red phosphor may include at least one of phosphors represented by $MSiN_2$, $MSiON_2$, and $M_2Si_5N_8$, where M is one of Ca, Sr, Ba, Zn, Mg, and Eu. In addition, the fluoride-based red phosphor may be a phosphor represented by $A_2MF_6:Mn^{4+}$, where A is one of Li, Na, K, Ba, Rb, Cs, Mg, Ca, Se, and Zn, and M is one of Ti, Si, Zr, Sn, and Ge.

Light emitted from the light emitting element may be produced by combination of light emitted from the first and second light emitting diode chips, light emitted from the green phosphor, and light emitted from the red phosphor, and a color gamut of the light may have an NTSC value of 100% or more.

The red phosphor may be formed to cover the green phosphor. In some exemplary embodiments, the green phosphor may be mixed with the red phosphor and disposed on the first and second light emitting diode chips. The red phosphor may be separated from the green phosphor.

The light emitting element may further include a housing having a cavity defined therein, such that the first and second light emitting diode chips are received in the cavity. The housing may include a plurality of cavities, and the first light emitting diode chip and the second light emitting diode chip may be received in different cavities, respectively.

A light emitting element according to another exemplary embodiment includes: a first light emitting diode chip emitting light having a peak wavelength in the range of 350 nm to 420 nm; a second light emitting diode chip separated from the first light emitting diode chip and emitting light having a peak wavelength in the range of 430 nm to 470 nm; a green phosphor formed on the first light emitting diode chip; and a red phosphor formed on the second light emitting diode chip, in which the green phosphor has a full width at half-maximum of 30 nm or less.

Hereinafter, exemplary embodiments will be described in more detail with reference to the accompanying drawings.

Figure 1:
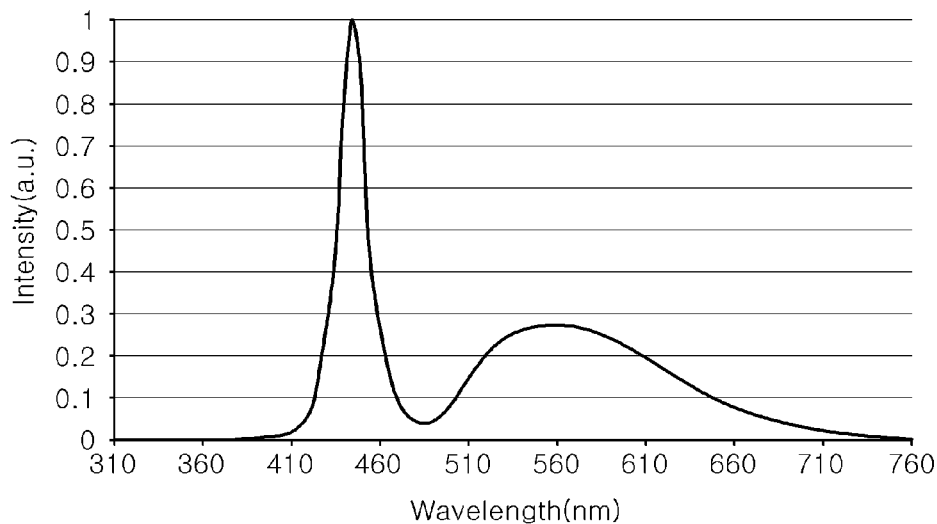
FIG. 1 is a graph depicting spectral distribution characteristics of light emitted from a light emitting element, in which yellow phosphors are applied to a conventional blue light emitting diode chip.
Figure 2:
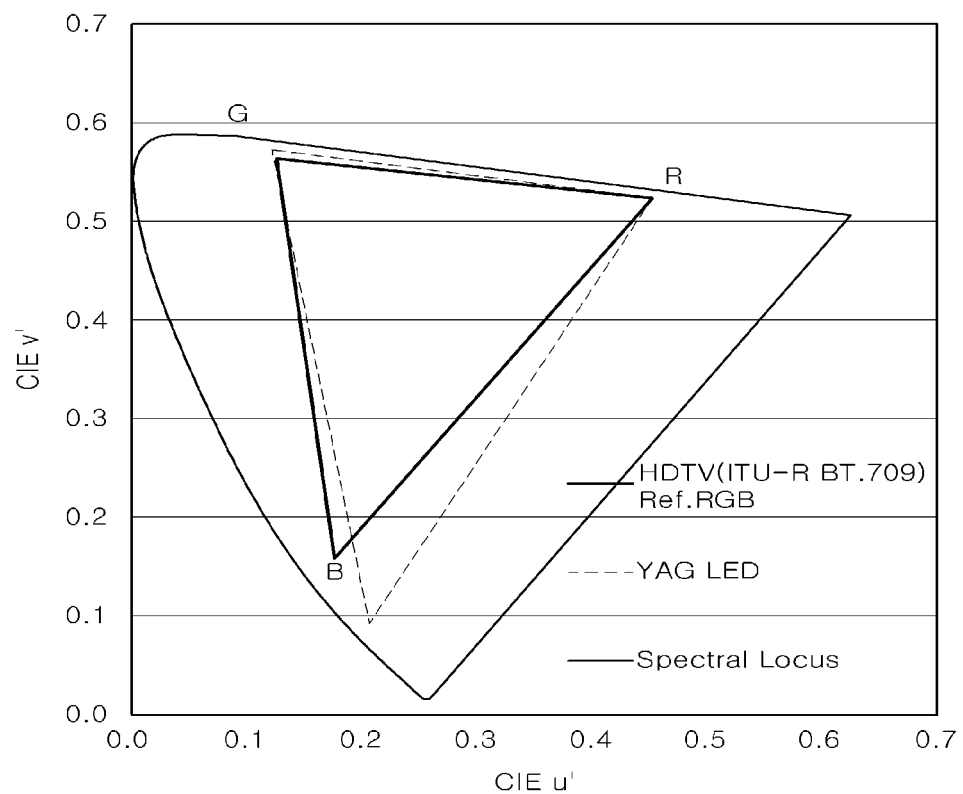
FIG. 2 is a graph comparing a color gamut of light emitted from the light emitting element, in which yellow phosphors are applied to a conventional blue light emitting diode chip with a color gamut of the HDTV standard.
Figure 3:
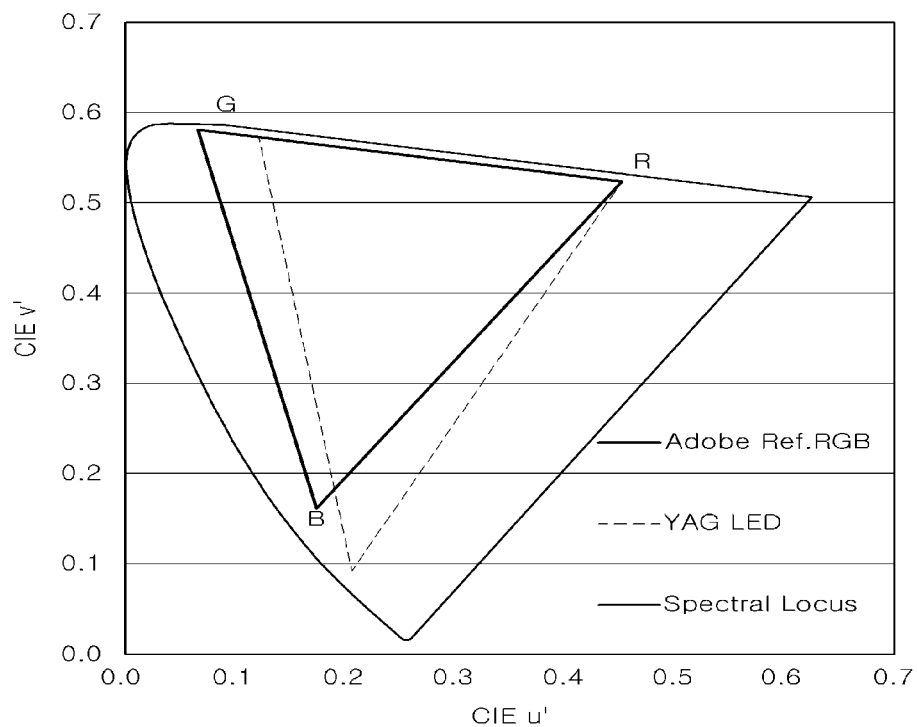
FIG. 3 is a graph comparing a color gamut of light emitted from the light emitting element, in which yellow phosphors are applied to a conventional blue light emitting diode chip with a color gamut of the Adobe standard.
Figure 4:
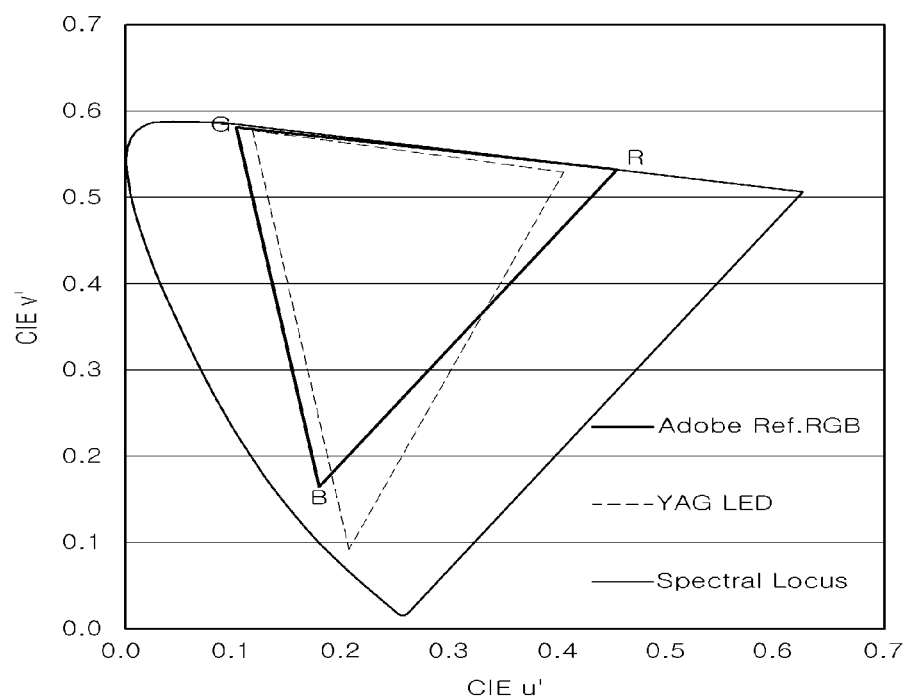
FIG. 4 is a graph comparing a color gamut of light emitted from the light emitting element, in which yellow phosphors are applied to a conventional blue light emitting diode chip with a color gamut of the D-Cinema standard.
Figure 5:
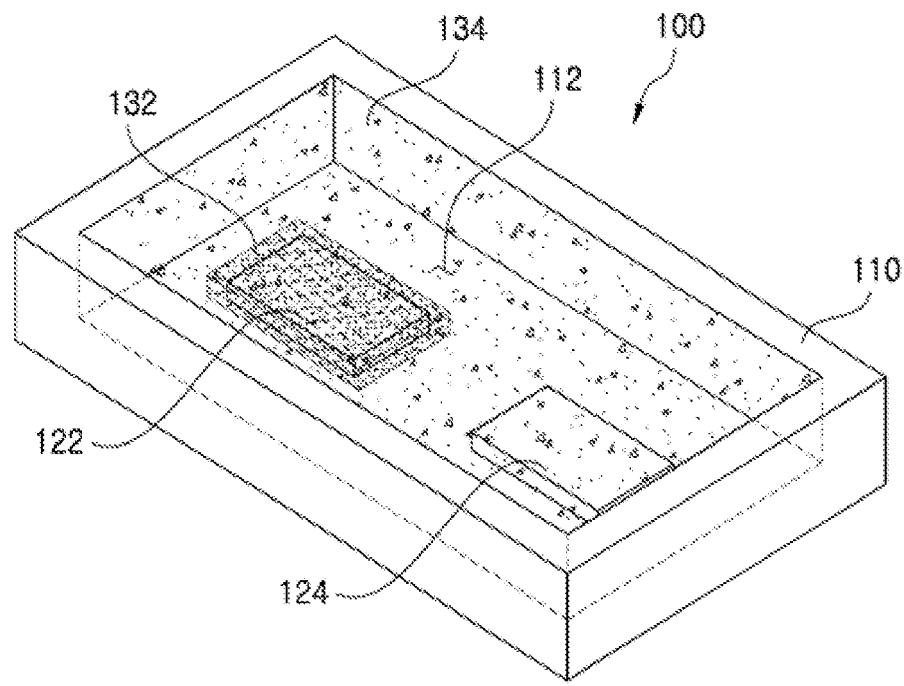
FIG. 5 is a schematic view of a light emitting element according to an exemplary embodiment.

FIG. 5 is a schematic view of a light emitting element according to an exemplary embodiment.

Referring to FIG. 5, a light emitting element 100 according to an exemplary embodiment includes a housing 110, a first light emitting diode chip 122, a second light emitting diode chip 124, a green phosphor 132, and a red phosphor 134.

The housing 110 has a cavity 112 defined therein, which is opened at one side thereof. First and second leads may be formed inside the housing 110 and supply external power to the first and second light emitting diode chips 122 and 124 therethrough. The housing 110 may be formed to cover a portion of the first and second leads. The cavity 112 may have a vertical wall or an inclined wall having a predetermined inclination as needed.

The housing 110 may be formed of an opaque silicone resin including a mixture of a phenyl silicone resin and a methyl silicone resin, and may have a white color. The wall defining the cavity 112 of the housing 110 may include a reflective facet capable of reflecting light emitted from the first and second light emitting diode chips 122 and 124.

The first and second light emitting diode chips 122 and 124 are received in the cavity 112 of the housing 110 and electrically connected to the first and second leads formed inside the housing 110. The first and second light emitting diode chips 122 and 124 may be connected in parallel or in series to each other, and electrically connected to the first and second leads, respectively.

Light emitted from the first light emitting diode chip 122 may be near-ultraviolet light having a peak wavelength in the range of about 350 nm to about 420 nm, specifically about 360 nm to 410 nm. Light emitted from the second light emitting diode chip 124 may be blue light having a peak wavelength in the range of 430 nm to 470 nm, specifically about 440 nm to 460 nm.

Each of the first and second light emitting diode chips 122 and 124 includes an n-type semiconductor layer and a p-type semiconductor layer to generate light through recombination of electrons and holes. In addition, an active layer may be interposed between the n-type semiconductor layer and the p-type semiconductor layer. With this structure, the first and second light emitting diode chips 122 and 124 may be a horizontal type, vertical type, or flip-chip type light emitting diode chip.

As shown in FIG. 5, the green phosphor 132 is formed to cover the first light emitting diode chip 122. The green phosphor 132 may be formed as a film and disposed on the first light emitting diode chip 122, or may be mixed with a transparent resin and deposited onto the first light emitting diode chip 122. Alternatively, the green phosphor 132 may be directly coated onto the first light emitting diode chip 122.

In one exemplary embodiment, the green phosphor 132 may be a BAM-based green phosphor. For example, the BAM-based green phosphor may be $(Ba,Sr,Ca)MgAl_{10}O1_7$: $Mn^{2+},Eu^{2+}$ or $BaMgAl_{10}O_{17}:Mn^{2+}$. The green phosphor 132 is formed to cover the first light emitting diode chip 122 in the cavity 112 of the housing 110 and may convert wavelengths of near UV light emitted from the first light emitting diode chip 122 into green light. The green phosphor 132 may cover the second light emitting diode chip 124. However, since the green phosphor exhibits poor efficiency in converting wavelength of light emitted from the second light emitting diode chip 124, the green phosphor 132 may be separated from the second light emitting diode chip 124 in order to prevent light loss.

As shown in FIG. 5, the red phosphor 134 may be formed to cover substantially the entire cavity 112 of the housing 110. Thus, the red phosphor 134 may be formed to directly contact the second light emitting diode chip 124, while covering the green phosphor 132 that covers the first light emitting diode chip 122. The red phosphor 134 may be a nitride or fluoride-based red phosphor. The nitride-based red phosphor may include at least one of phosphors represented by $MSiN_2$, $MSiON_2$, and $M_2Si_5N_8$, where M is one of Ca, Sr, Ba, Zn, Mg, and Eu. In addition, the fluoride-based red phosphor may be represented by $A_2MF_6:Mn^{4+}$, where A is one of Li, Na, K, Ba, Rb, Cs, Mg, Ca, Se, and Zn, and M is one of Ti, Si, Zr, Sn, and Ge.

Figure 6:
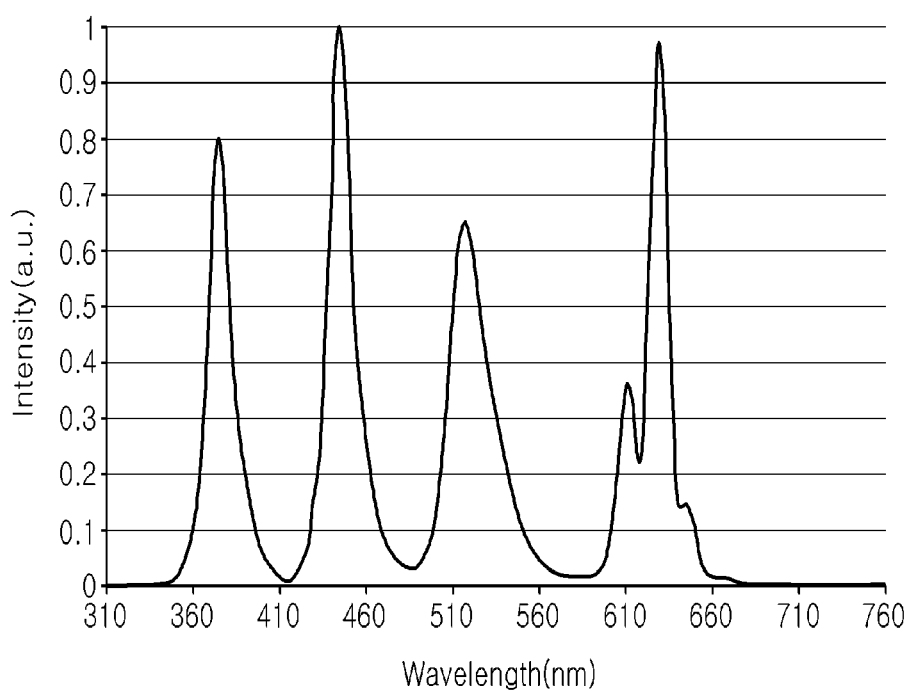
FIG. 6 is a graph depicting spectral distribution characteristics of light emitted from the light emitting element according to an exemplary embodiment.

FIG. 6 is a graph depicting spectral distribution characteristics of light emitted from the light emitting element according to an exemplary embodiment.

Referring to FIG. 6, in the light emitting element 100 according to an exemplary embodiment, the green phosphor 132 is formed on the first light emitting diode chip 122, which emits light in the near UV wavelength range, and the red phosphor 134 is formed on the second light emitting diode chip 124, which emits blue light. Here, light in the near UV wavelength range emitted from the first light emitting diode chip 122, light in the blue wavelength range emitted from the second light emitting diode chip 123, green light emitted from the green phosphor 132, and red light emitted from the red phosphor 133 are observed. The BAM-based green phosphor according to the illustrated exemplary embodiment has a considerably narrow full width at half-maximum of about 30 nm or less.

Figure 7:
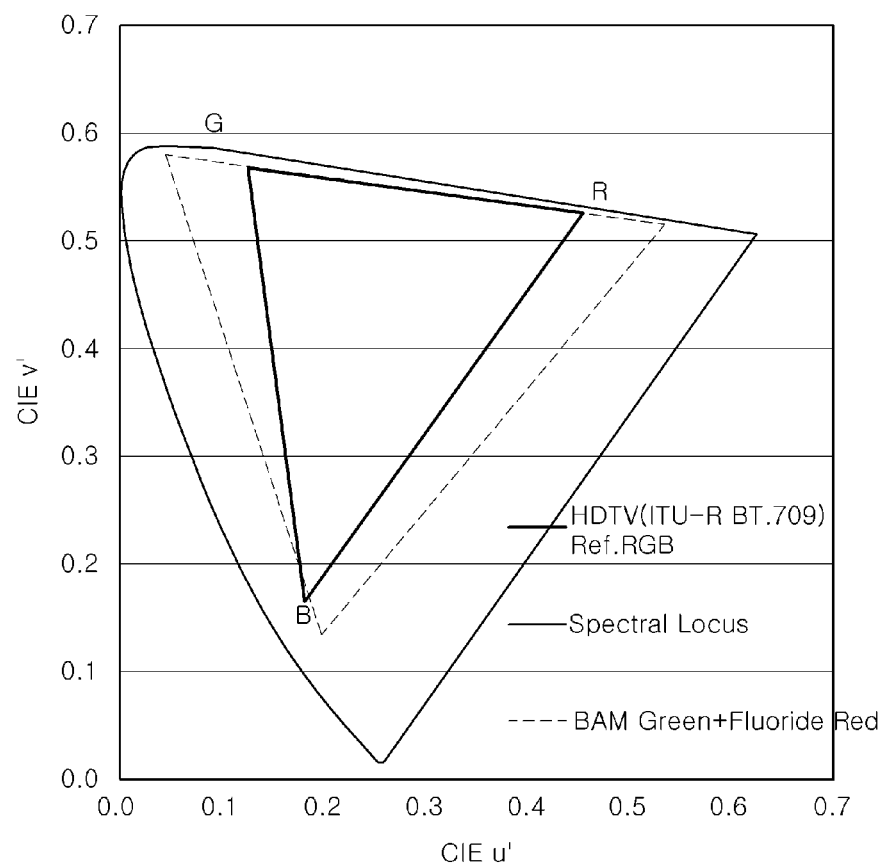
FIG. 7 is a graph comparing a color gamut of light emitted from the light emitting element according to an exemplary embodiment with the color gamut of the HDTV standard.
Figure 8:
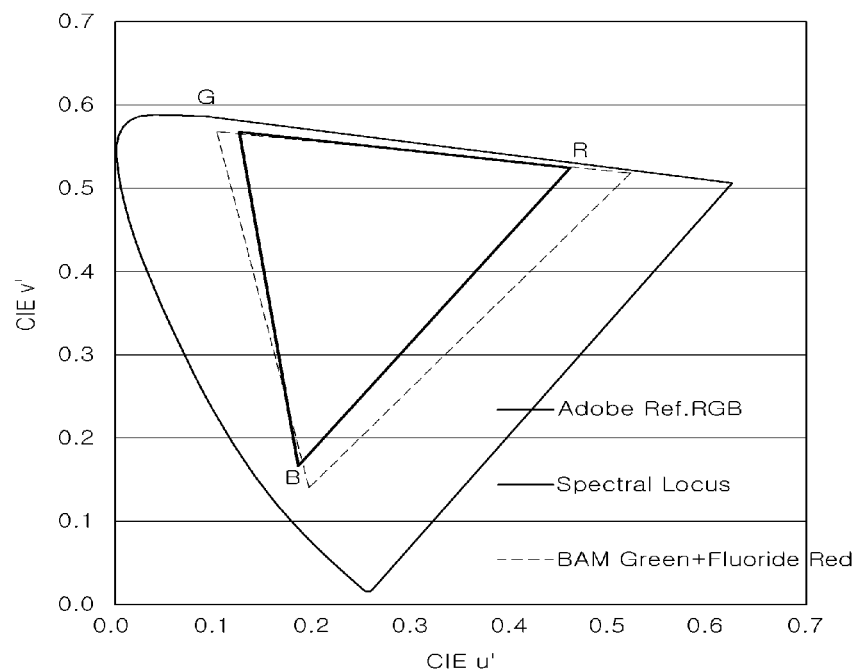
FIG. 8 is a graph comparing the color gamut of light emitted from the light emitting element according to an exemplary embodiment with the color gamut of the Adobe standard.
Figure 9:
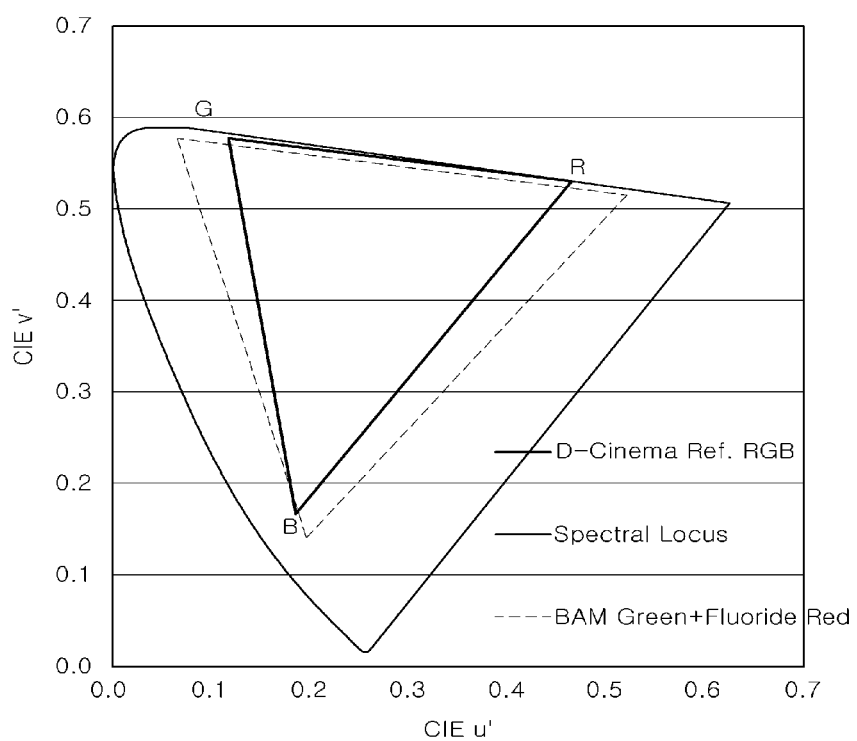
FIG. 9 is a graph comparing the color gamut of light emitted from the light emitting element according to an exemplary embodiment with the color gamut of the D-Cinema standard.

FIG. 7 is a graph comparing a color gamut of light emitted from the light emitting element according to an exemplary embodiment with the color gamut of the HDTV standard. FIG. 8 is a graph comparing the color gamut of light emitted from the light emitting element 100 according to an exemplary embodiment with the color gamut of the Adobe standard. FIG. 9 is a graph comparing the color gamut of light emitted from the light emitting element 100 according to an exemplary embodiment with the color gamut of the D-Cinema standard.

The RGB coordinates with respect to light emitted from the light emitting element 100 according to the illustrated exemplary embodiment may be represented by R(x 0.677, y 0.3), G(x 0.151, y 0.737) and B(x 0.154, y 0.047) in the CIE xy coordinate system, and by R(u' 0.516, v' 0.515), G(u' 0.052, v' 0.575) and B(u' 0.189, v' 0.131) in the CIE u'v' coordinate system. Here, the RGB coordinates of light, which is produced through combination of light components emitted from the light emitting elements, can be obtained using a color filter.

As shown in FIG. 7, it can be seen that light emitted from the light emitting element 100 includes substantially an entire color gamut of the HDTV standard. In addition, it can be seen that light emitted from the light emitting element 100 includes substantially an entire color gamut of the Adobe standard, as shown in FIG. 8, and that the light emitted from the light emitting element 100 includes substantially an entire color gamut of the D-Cinema standard, as shown in FIG. 9. That is, the light emitting element 100 according to the illustrated exemplary embodiment including the first light emitting diode chip 122 emitting light in the near UV wavelength range, the BAM-based green phosphor, the second light emitting diode chip 124 emitting light in the blue wavelength range, and the nitride-based red phosphor or the fluoride-based red phosphor, realizes a color gamut having higher purity than the color gamut of the HDTV standard. Furthermore, the color gamut of light emitted from the light emitting element 100 according to the illustrated exemplary embodiment has higher purity than the color gamut of the Adobe standard or the D-Cinema standard.

As shown in Table 1, the light emitting element 100 according to the illustrated exemplary embodiment can realize a color gamut increased by about 30% or more compared to the color gamut of a conventional light emitting element.

TABLE 1

| | Color gamut area ratio | | |
|---|---|---|---|
| | HDTV standard | Adobe standard | D-Cinema standard |
| Conventional | 116% | 102% | 93% |
| Exemplary embodiment | 152% | 133% | 122% |
| Difference | +36% | +31% | +28% |

Figure 10A:
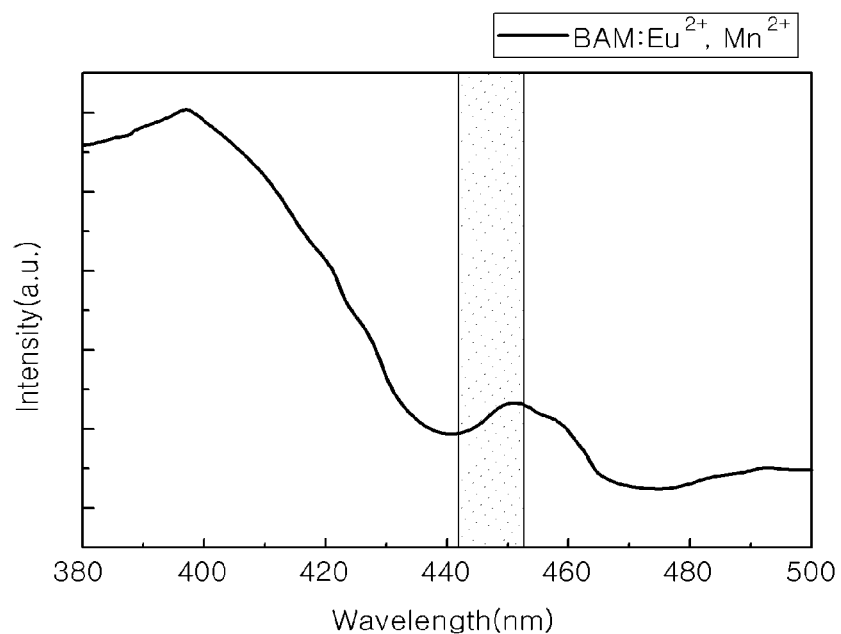
FIG. 10A and FIG. 10B show light excitation spectra of a green phosphor and a red phosphor according to exemplary embodiments.
Figure 10B:
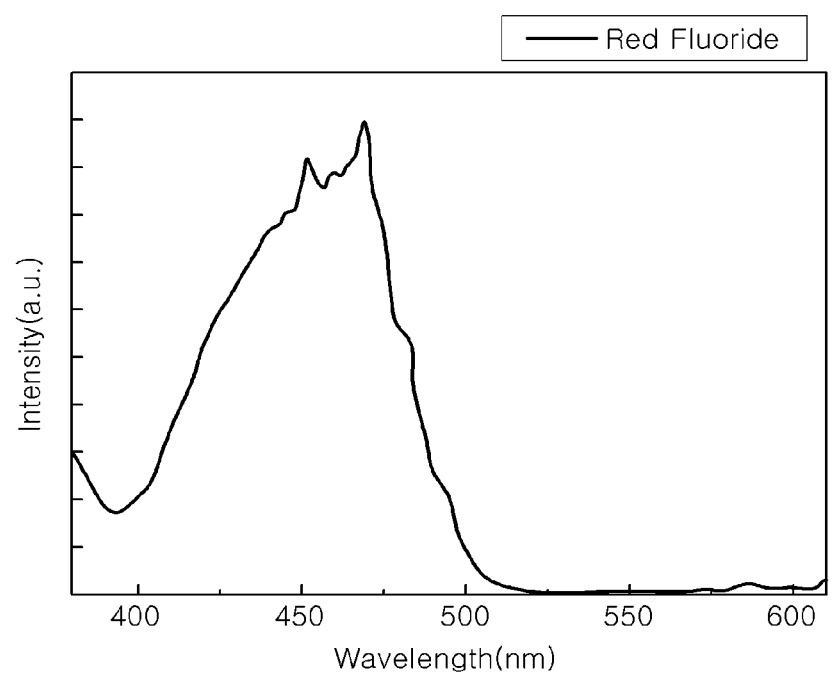
Figure 11:
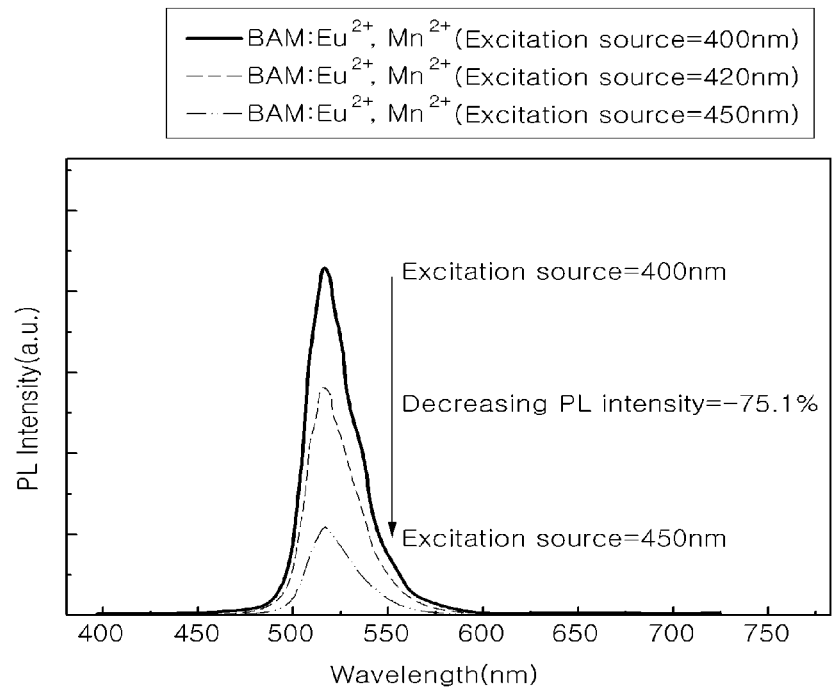
FIG. 11 is a graph depicting a relationship between luminous intensity and wavelength of an excitation source for the green phosphor according to an exemplary embodiment.

FIG. 10A and FIG. 10B show light excitation spectra of a green phosphor and a red phosphor according to an exemplary embodiment, and FIG. 11 is a graph depicting a relationship between luminous intensity and wavelength of an excitation source for the green phosphor 132 according to an exemplary embodiment.

Referring to FIG. 10A and FIG. 10B, it can be seen that the BAM-based green phosphor used for the light emitting element according to an exemplary embodiment exhibited efficient excitation at a wavelength of about 410 nm or less, and the fluoride-based red phosphor used for the light emitting element according to an exemplary embodiment exhibited efficient excitation at a wavelength of about 460 nm.

In addition, as shown in FIG. 11, it can be seen that the BAM-based green phosphor exhibited better efficient excitation with decreasing wavelength of light used as an excitation source. That is, it can be seen that the BAM-based green phosphor exhibited more efficient excitation when light emitted from light emitting diode chip has a peak wavelength of about 400 nm, as compared to the light emitted from the light emitting diode chip having a peak wavelength of about 450 nm. Accordingly, in the light emitting element according to an exemplary embodiment, the BAM-based green phosphor is applied to the first light emitting diode chip 122 emitting near UV light, instead of being applied to the light emitting diode chip emitting blue light, thereby further improving efficiency of the BAM-based green phosphor.

Figure 12A:
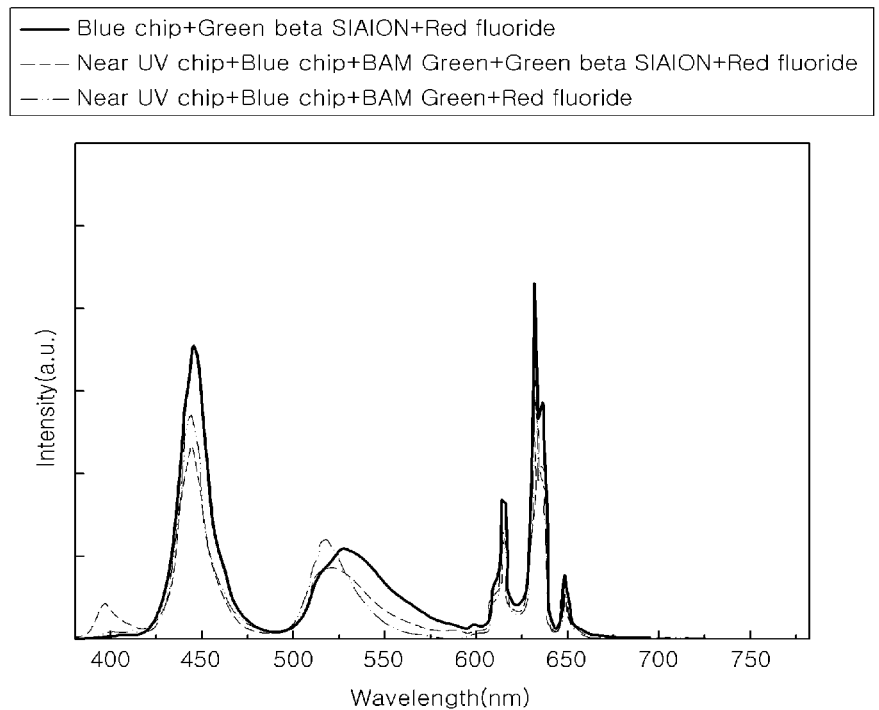
FIG. 12A and FIG. 12B are graphs comparing luminous intensity of light emitted from the light emitting element according to an exemplary embodiment.
Figure 12B:
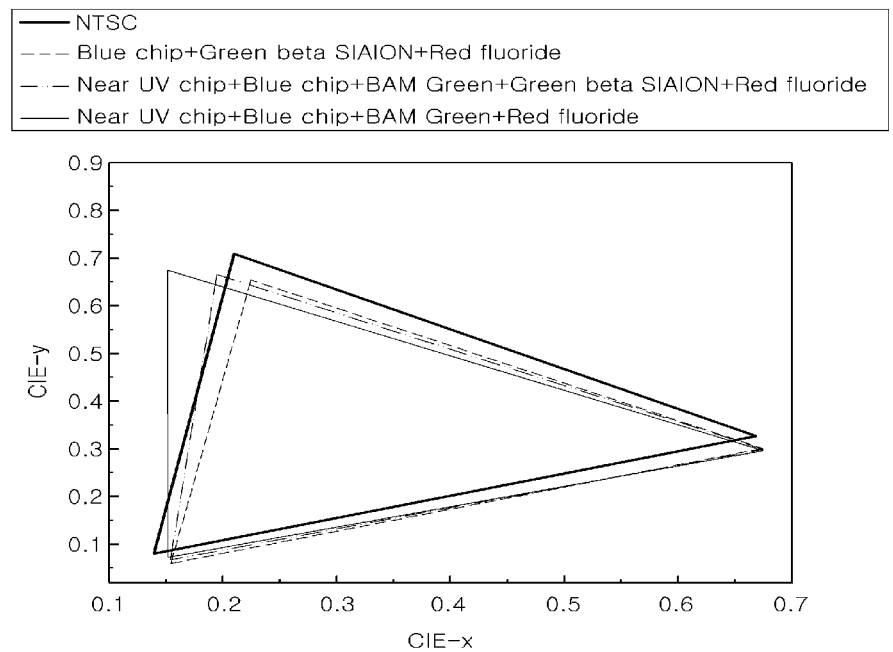

FIG. 12A and FIG. 12B are graphs comparing luminous intensity of light emitted from the light emitting element according to exemplary embodiments.

Referring to FIG. 12A and FIG. 12B, the light emitting element according to a first exemplary embodiment has a structure, in which the BAM-based green phosphor is applied to the first light emitting diode chip 122 emitting near UV light and the fluoride-based red phosphor is applied to the second light emitting diode chip 124 emitting blue light. A light emitting element according to a second exemplary embodiment has a structure, in which the BAM-based green phosphor and a SiAlON-based green phosphor are applied to a light emitting diode chip emitting near UV light and a fluoride-based red phosphor is applied to a light emitting diode chip emitting blue light. Further, a light emitting element according to a third exemplary embodiment includes a structure, in which a SiAlON-based green phosphor is applied to a light emitting diode chip emitting blue light and a fluoride-based red phosphor is applied to another light emitting diode chip emitting blue light.

FIG. 12A is a graph depicting spectral distribution characteristics of the light emitting elements 100 of the first to third exemplary embodiments. As shown in FIG. 12A, it can be seen that the peak wavelength of green light emitted from the light emitting element 100 of the first exemplary embodiment had the smallest full width at half-maximum. In addition, from FIG. 12b, it can be seen that the color gamut of the light emitting element of the first exemplary embodiment is closest to the color gamut of the NTSC standard.

Table 2 shows numerical values of color gamut of the first to third exemplary embodiments.

TABLE 2

| | Initial Optical Properties | | |
|---|---|---|---|
| | CIE-x | CIE-y | Relative color gamut (NTSC = 100%) |
| Third Exemplary Embodiment | 0.280 | 0.238 | 92.4% |
| Second Exemplary Embodiment | 0.281 | 0.237 | 96.2% |
| First Exemplary Embodiments | 0.258 | 0.216 | 105.7% |

Figure 13:
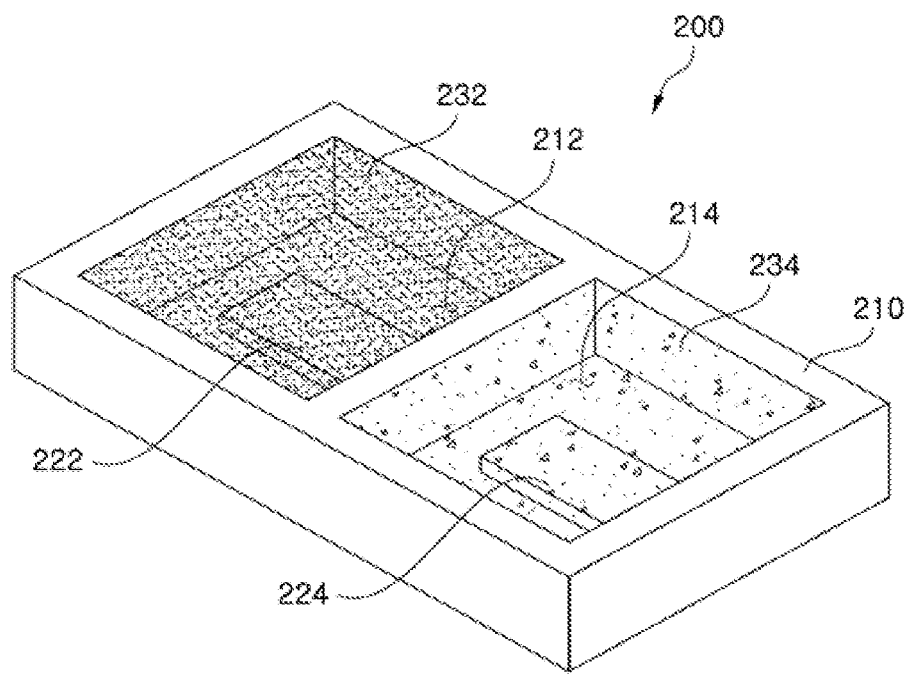
FIG. 13 is a schematic view of a light emitting element according to another exemplary embodiment.

FIG. 13 is a schematic view of a light emitting element according to another exemplary embodiment.

Referring to FIG. 13, a light emitting element 200 according to another exemplary embodiment includes a housing 210, a first light emitting diode chip 222, a second light emitting diode chip 224, a green phosphor 232, and a red phosphor 234. Detailed description of substantially the same components described above will be omitted to avoid redundancy.

The housing 210 has two cavities 212 and 214 defined therein, each of which is opened at one side thereof. In addition, the housing 210 may be formed with first and second leads to supply electric power to the first and second light emitting diode chips 222 and 224. In the illustrated exemplary embodiment, a first light emitting diode chip 222 is received in the first cavity 212 and a second light emitting diode chip 224 is received in the second cavity 214.

The green phosphor 232 may be formed to cover substantially the entire first cavity 212 while covering the first light emitting diode chip 222. Here, the green phosphor 232 may be a BAM-based green phosphor described above.

The red phosphor 234 may be formed to cover substantially the entire second cavity 214 while covering the second light emitting diode chip 224, and may include a nitride or fluoride-based red phosphor as described above.

Although some exemplary embodiments have been described herein, it should be understood by those skilled in the art that these embodiments are given by way of illustration only, and that various modifications, variations, and alterations can be made without departing from the spirit and scope of the invention. Therefore, the scope of the present invention should be limited only by the accompanying claims and equivalents thereof.

What is claimed is:

1. A light emitting element comprising:
    a housing including a plurality of walls defining a cavity having one side thereof opened;
    a light emitting part disposed in the cavity and configured to emit light having a peak wavelength in a blue wavelength band, the light emitting part including a first light emitting chip and a second light emitting chip spaced apart from each other; and
    a wavelength converter disposed on the light emitting part and including a first phosphor layer having a first thickness and a second phosphor layer having a second thickness greater than the first thickness and directly contacting the first phosphor layer, the first phosphor layer includes a first phosphor mixed in the first phosphor layer and is configured to emit light having a peak wavelength in a green wavelength band, and the second phosphor layer includes a second phosphor and is configured to emit light having a peak wavelength in a red wavelength band,
    wherein the first thickness and the second thickness are each measured from a top surface of the light emitting part in a direction normal to the top surface of the light emitting part, and
    wherein the second phosphor comprises a fluoride-based red phosphor represented by $A_2MF_6:Mn^{4+}$, wherein A is one of Li, Na, K, Ba, Rb, Cs, Mg, Ca, Se, and Zn, and M is one of Ti, Si, Zr, Sn, and Ge.

2. The light emitting element comprising of claim 1, wherein the housing has a white color and comprises an opaque silicone resin including a mixture of a phenyl silicone resin and a methyl silicone resin.

3. The light emitting element comprising of claim 1, wherein light emitted from the light emitting element is a combination of light emitted from the first and second light emitting diode chips, light emitted from the first phosphor, and light emitted from the second phosphor.

4. The light emitting element comprising of claim 3, wherein light emitted from the light emitting element has a color gamut of an NTSC value of about 90% or more.

5. The light emitting element comprising of claim 1, wherein at least one of the plurality of walls includes a reflective facet configured to reflect light emitted from the first and second light emitting diode chips.

6. The light emitting element comprising of claim 1, wherein the second phosphor layer is disposed on the first phosphor layer.

7. The light emitting element comprising of claim 1, wherein a thickness of a first portion of the first phosphor layer overlapping the light emitting part is different from a thickness of a second portion of the first phosphor layer not overlapping the plurality of walls.

8. A light emitting element comprising:
    a housing including a plurality of walls defining a cavity having one side thereof opened;
    a light emitting part disposed in the cavity and configured to emit light having a peak wavelength in a blue wavelength band, the light emitting part including a first light emitting diode chip and a second light emitting diode chip spaced apart from each other;
    a lead portion formed in the housing and configured to supply external electric power to the light emitting part; and
    a wavelength converter disposed on the light emitting part and including a first phosphor layer having a first thickness and a second phosphor layer having a second thickness greater than the first thickness and directly contacting each other, the first phosphor layer includes a first phosphor mixed in the first phosphor layer and is configured to emit light having a peak wavelength in a green wavelength band, and the second phosphor layer includes a second phosphor and is configured to emit light having a peak wavelength in a red wavelength band,
    wherein:
    the first thickness and the second thickness are each measured from a top surface of the light emitting part in a direction normal to the top surface of the light emitting part;
    the second phosphor comprises a fluoride-based red phosphor; and
    at least one of the plurality of walls extends vertically with respect to a bottom surface of the housing.

9. The light emitting element comprising of claim 8, wherein the fluoride-based red phosphor is represented by $A_2MF_6:Mn^{4+}$, wherein A is one of Li, Na, K, Ba, Rb, Cs, Mg, Ca, Se, and Zn, and M is one of Ti, Si, Zr, Sn, and Ge.

10. The light emitting element comprising of claim 8, wherein light emitted from the light emitting element is a combination of light emitted from the first and second light emitting diode chips, light emitted from the first phosphor, and light emitted from the second phosphor.

11. The light emitting element comprising of claim 10, wherein light emitted from the light emitting element has a color gamut of an NTSC value of about 90% or more.

12. The light emitting element comprising of claim 8, wherein the at least one of the plurality of walls includes a reflective facet configured to reflect light emitted from the first and second light emitting diode chips.

13. The light emitting element comprising of claim 8, wherein the second phosphor layer is disposed on the first phosphor layer.

14. The light emitting element comprising of claim 8, wherein a thickness of a first portion of the first phosphor layer overlapping the light emitting part is different from a thickness of a second portion of the first phosphor layer not overlapping the plurality of walls.

* * * * *